United States Patent

[11] 3,566,190

[72] Inventors Virgil J. Huebner
Sioux Falls;
David L. Brown, Parker, S. Dak.
[21] Appl. No. 786,328
[22] Filed Dec. 23, 1968
[45] Patented Feb. 23, 1971
[73] Assignee Raven Industries, Inc.
Sioux Falls, S. Dak.

[54] INDUSTRIAL CONTROL SYSTEM WITH MEANS FOR RELEASABLY SECURING A PLURALITY OF ELECTRONIC MODULES
10 Claims, 8 Drawing Figs.

[52] U.S. Cl. .......... 317/100, 317/101, 317/119
[51] Int. Cl. .......... H01b 1/04, H05k 5/02
[50] Field of Search .......... 317/99—101, 119—120; 174/52, 59; 317/112, 120, 101 (CB), (CM), (DH); 174/(HS)

[56] References Cited

UNITED STATES PATENTS

| | | | |
|---|---|---|---|
| 3,267,333 | 8/1966 | Schultz .......... | 317/100 |
| 3,147,402 | 9/1964 | Hochstetler .......... | 317/101X |
| 3,268,772 | 8/1966 | Kamei .......... | 317/100 |
| 3,360,689 | 12/1967 | Haury .......... | 317/101 |
| 3,375,408 | 3/1968 | Buhrendorf .......... | 317/101 |
| 3,406,368 | 10/1968 | Curran .......... | 317/101X |

FOREIGN PATENTS

| | | | |
|---|---|---|---|
| 1,249,958 | 9/1967 | Germany .......... | 317/101 |
| 1,147,280 | 4/1963 | Germany .......... | 317/101 |

*Primary Examiner*—Lewis H. Myers
*Assistant Examiner*—Gerald P. Tolin
*Attorney*—Hill, Sherman, Meroni, Gross & Simpson

ABSTRACT: Control apparatus for industrial control applications in which modular construction includes a plurality of rail systems each having means for releasably securing thereto a plurality of electronic logic circuit modules. Each of the rail systems includes a pair of spaced-apart side rails which carry a circuit board having a plurality of plug-in type electrical connectors secured thereto to form a mother board assembly for receiving respective ones of the electronic logic modules. All module wiring for input output and intermodule connections lie on the front side of the rail system circuit board. The spaced-apart rails of the rail system and module locking bars, which secure the modules to prevent mechanical shock and vibrations, together provide tunnels for the wiring which acts as a partial Faraday shield to prevent such wiring from acting as an antenna in the environment of industrial control applications wherein large amounts of uncontrolled electromagnetic radiation may occur, such as in the operation of large dynamoelectric equipment.

The power distribution system of the control apparatus is provided by a plurality of printed conductors on the back side of a circuit board carried on each rail system and by a plurality of bus bars which interconnect the conductors of the individual rail systems to the power supply. The printed conductors of the circuit board and the bus bars are of exceptionally large dimensions so as to provide a low impedance path for noise in order to prevent the deleterious effects of noise in the electronic modules.

The plurality of electronic logic modules are individually housed free from foreign matter in wedge-shaped containers which, when placed in a stacked vertical alignment form chimneys for cooling of the equipment and which provide an ample amount of room for the insertion and articulation of test probes to terminals located between the wedge-shaped housings.

INVENTORS
VIRGIL J. HUEBNER
DAVID L. BROWN

BY Hill Sherman Meroni Gross Simpson ATTORNEYS

INVENTORS
VIRGIL J. HUEBNER
DAVID L. BROWN

BY Hill Sherman Meroni Gross & Simpson ATTORNEYS

INVENTORS
VIRGIL J. HUEBNER
DAVID L. BROWN

BY Hill Sherman Meroni Gross & Simpson ATTORNEYS

INDUSTRIAL CONTROL SYSTEM WITH MEANS FOR RELEASABLY SECURING A PLURALITY OF ELECTRONIC MODULES

BACKGROUND OF THE INVENTION

1. Field of the Invention

This invention relates to computer-type control apparatus, and more particularly to electronic logical control apparatus of modular construction for industrial control applications wherein such apparatus is subjected to uncontrolled electromagnetic radiations and mechanical vibrations, and wherein such apparatus includes structures for mechanically securing the electronic circuits thereof and for preventing noise due to electromagnetic radiation from affecting the operation of the control system.

2. Description of the Prior Art

It is generally well known to provide a plurality of plug-in electronic circuit boards as a modular form of an electrical control system. This type of apparatus has been employed to a great extent in the past in the computer, telemetry, radio, television, and telephone fields as a means of providing ease of manufacture, assembly, alterability and maintenance. However, equipment installations in the aforementioned technical fields, are usually provided in such a manner that the control apparatus is located in a controlled environment wherein the electronic circuitry of the individual circuit boards or modules are not subjected to the mechanical vibrations of or the noise generating effects of electromagnetic radiation as is generally attendant with heavy industrial equipment. Generally, the mere isolation of the aforementioned electronic systems from their controlled or controlling apparatus prevents such systems from being effected by vibrations and/or electromagnetic radiation. However, when electronic apparatus is applied to an industrial system, it is normally located within the effective range of both the magnetic radiation and mechanical vibration of its environment and is therefore subjected to and adversely effected by such adverse conditions. For any given installation, special consideration could, of course be given to the operating environment with respect to the electronic control apparatus; however, it is highly desirable that a single design construction be applicable to all possible environmental situations. Therefore, the present invention, contrary to prior designs provides an electronic logic control system for industrial control applications which may be employed in a wide variety of environmental conditions.

SUMMARY OF THE INVENTION

Briefly, the present invention provides apparatus for mounting a plurality of electronic logic modules in spaced-apart relationship, each of the logic modules having a wedge-shaped housing for greater heat dissipation and which cooperates with other such housings to form air passageways for cooling the control system. The individual logic modules are of the plug-in type wherein a printed circuit board is releasably engaged in an electrical connector. A plurality of such electrical connectors are carried in an aligned relationship both vertically and horizontally to form an array of spaced-apart modules. Each row of the array includes a plurality of electrical connectors electrically and mechanically connected to a common printed circuit board to form a mother board assembly which is carried on a rail system which partially provides a Faraday shield for the wiring of the apparatus from electromagnetic radiation. Each rail system comprises a pair of parallel spaced-apart L-shaped elongate metal strips to which the respective mother board assembly is secured. Each of the rail systems also comprise upstanding portions which carry a second pair of spaced-apart L-shaped elongate members having aligned notches therein for receiving and locking the electronic logic modules in a spaced-apart secured relationship and which cooperate with the aforementioned L-shaped members in forming the Faraday shield. In a particular design this shielding was especially effective in the 1 to 10 megacycle range, the range of greatest problem for electrical noise in industrial environments.

Each of the electrical connectors includes contacts which provide input and output connections for the logic modules. These contacts are extended to the input and output terminal blocks of the apparatus by way of pins which extend from the contacts through the common printed circuit board to the back side of such board whereat a second set of pins are electrically connected thereto and extend such connections back to the front side of the common printed circuit board. The apparatus is therefore adapted to receive its input and output wiring on the front side of the common printed circuit boards in the area of the Faraday shield. The second set of pins also advantageously provide test points fort for the apparatus. The wedge shape of the logic modules is also noteworthy in this respect in that the pins which serve as test points extend into the air passages provided for cooling and are therefore easily accessible by means of test probes.

The logic control system is provided with a power distribution system which, in the embodiment particularly illustrated herein, includes three bus bars that extend across and are electrically and mechanically connected to distribution apparatus of each rail system. The extension of power from each bus bar to the operating circuitry of the electronic modules is provided on the back side of the common printed circuit boards by printed circuit conductors. These printed circuit conductors and the bus bars are provided with dimensions which are much greater than that normally applied to such low voltage circuitry. The greater dimensions of the bus bars and the power distribution printed circuits provides a greater skin area of conductors and accordingly a very low impedance path for noise, and consequently low voltage drops between the electronic modules and the power supply thereby increasing the noise immunity of the system.

The primary object of the present invention therefore, is to provide new and improved apparatus for mounting logic control circuits in an industrial environment.

Another object of the invention is to provide an improved means for preventing mechanical vibration of electronic modules for industrial control systems.

Another object of the invention is to provide improved apparatus for mounting electronic circuit modules in which the mounting hardware for the circuit modules is included in structural apparatus which provides air passages for cooling the electronic components.

Another object of the invention is to provide electronic control circuitry in a modular form for industrial applications wherein the wiring between input and output terminals and intermodule electrical connections are substantially shielded from electromagnetic radiation to aid in providing noise immunity for the electronic control circuits.

Another object of the invention is to provide electronic control circuitry for industrial applications wherein the power distribution system for the electronic circuitry functions as a low impedance path to noise.

BRIEF DESCRIPTION OF THE DRAWINGS

The aforementioned and other objects and features of the invention, and the organization, construction and operation of the invention will be best understood from the following detailed description taken in conjunction with the accompanying drawings in which:

FIG. 7A is a schematic representation of an industrial control situation, while FIG. 7B illustrates a circuit for controlling the apparatus of FIG. 7A.

DESCRIPTION OF THE PREFERRED EMBODIMENT

Figure 1:
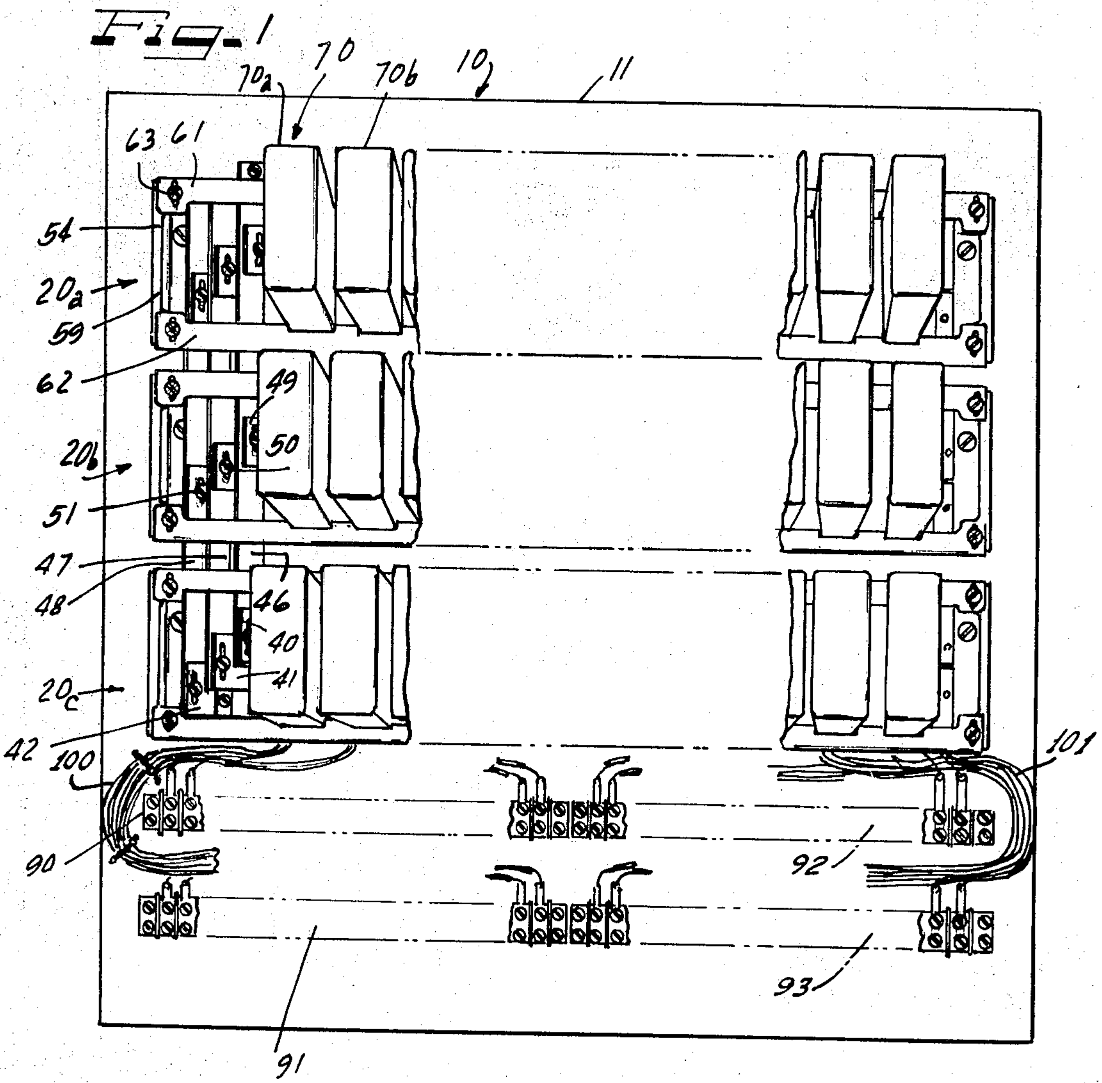
FIG. 1 is an elevational view of electronic control apparatus of modular construction according to the principles of the present invention showing the assembly of a plurality of module supporting rail systems to a frame.

In the drawings, particularly FIGS. 1—6, there is shown at 10 a modular control system construction for industrial applications which generally comprises a mounting board or frame 11, a plurality of rail systems 20 further referenced 20*a*—20*c* carried on the frame, a plurality of electronic logic modules 70 further referenced 70*a*—70*n* carried by the rail systems, a plurality of terminal strips 90—93, and a plurality of wiring harness 100 and 101 which extend between the terminal strips 90—93 and the electronic modules 70.

Each of the electronic modules 70 includes a wedge-shaped casing which tapers inwardly in the direction toward the rail systems. The casings provide means for mounting electronic circuit boards 77 within individually closed compartments that are free from foreign matter and maintained in individual clean environments. The shape of the casings provide a large available surface for heat dissipation from the electronic components to the exterior of the modules than would be provided by a rectangular parallelopiped casing construction. The wedge shape of the casings also provide similar wedge-shaped open areas 110 between adjacent modules which together form chimneys for air circulation and cooling when the frame 11 is vertically mounted in a cabinet (not shown) as illustrated in FIG. 1 with the terminal strips 90—93 located at the lower end.

Each of the rail systems illustrated provide several features and each comprise a pair of spaced-apart metal members 21 and 22 having respective slotted flanges 23, 24, 25 and 26 for mounting the members to the frame 11 by way of machine screws 58. Secured to the rails 21 and 22 by a plurality of machine screws or rivets 28 is a mother board assembly including a substrate 27, preferably of an epoxy glass material, having mechanically secured thereto by means of machine screws 35, a plurality of electrical connector devices 29 having a body 30 including spring contacts 31 which releasably engage both mechanically and electrically the printed circuit boards 77 of the individual modules 70.

A plurality of power distribution connectors 40, 41 and 42 are secured to the front side of the substrate 27 by means of screws 43, 44 and 45. The screws provide mechanical support and the electrical connection is provided by a pin connected to the conductive surface of the board. The distribution connectors 40, 41 and 42 are disposed in a spaced-apart relation for connection to power distribution buses 46, 47 and 48 which extend vertically across the plurality of rail systems and are connected to corresponding power distribution connectors of each rail system by machine screws 49, 50 and 51. The buses 46, 47 and 48 directly connected to the power supply of the control system. The connectors 41, 42 and 43 are slotted to allow for tolerance buildup, in the positioning of the rails, in a control system using plural mounting rails.

As can be easily ascertained from the drawings, screws 43, 44 and 45 which mechanically secure the power distribution connectors 40, 41 and 42 to the front side of the substrate 27 are also employed on the back side of the substrate along with the wide printed conductors 52, 53 and 54 to distribute the power supply potentials to the individual modules 70. It should be appreciated that the power buses 46, 47 and 48, the bus connectors 40, 41 and 42, and the printed distribution conductors 52, 53 and 54 are of relatively large dimensions, contrary to conventional practice, so that the large skin area provided thereby is effective as a low impedance path for noise between the power supply and the electronic modules as a means for aiding in providing noise immunity to the control apparatus. The cross-sectional dimensions of the buses of a particular design are advantageously established at one-half × three-sixteenth inches.

On the back side of the substrate 27 it can also be seen that the electrical connectors 29 each include a plurality of pins 36 which are electrical circuit extensions of the printed circuit boards of the modules. Another plurality of pins 37 extend between the back and front sides of substrates 27 to provide input and output terminals for the individual modules 70 on the front side of the substrate 27. In this manner all wiring to the harness 100 and 101 and between the modules 70 may be made on the front side of the substrates 27 and the pins 35 may be employed as test points. The pins 35 may take the form of cam-type screw driver operated terminals 38 on the front of substrate 27 or the form of pins 38*a* for machine wrapped connections, both types being shown in the drawings. Connectors such as miniature terminal blocks where a plate is held by a screw to clamp stranded wire therein may also be employed The wedge shape of the air spaces on the front side of the substrate 27 advantageously provides ample room for articulation of a test probe immediately adjacent the individual modules.

During manufacture the substrates 27 are processed in a known manner r prepare for the formation of the electrical circuits on the back side thereof and all holes are drilled. The connectors 29 are temporarily secured to the substrates 27 by inserting pins 36 thereof through the holes provided therefor. Next all machine screws which act as conductors as well as mechanical fasteners, for example screws 43, 44 and 45, are fixed in place and the back sides of the substrates are subjected to flow soldering to provide conductors 39, 52, 53 and 54 thereon. The mother boards so formed are then secured to rails 21 and 22. The rails 21 and 22 and their end elements 54 and 55 may then be secured to frame 11 by screws 58 through flanges 23, 24, 25, 26, 56 and 57.

After the assembly procedure just set forth the necessary inter-module wiring may be connected to connecting posts 38 and the harnesses 100 and 101 may be formed and connected in position. The rail systems are then ready to receive the logic modules 70.

The electronic modules 70 are insured that each module will be bottomed to a predetermined level for proper mechanical and electrical connection thereof to its respective connector 29 by means of generally U-shaped clamping springs 33 which cooperate with the bulb-shaped boss portions 75—76 of the module casings. The clamping springs 33 are secured to each end 32 of the connectors 29 by machine screws 35 which also provide a mechanical attachment of the connectors 29 to the substrate 27. As the circuit boards 77 of the modules 70 are inserted to connectors 29, the clamping springs 33 receive the bosses and as the section of greatest diameter pass the bosses the tips 34 of spring 33, the springs provide a downward pulling force on the module casing. Upon seating the modules are provided with additional strain relief afforded by the clamping springs 33 and the bosses.

A pair of L-shaped L-shape locking bars 61 and 62 are secured between the flanges 59 and 60 by machine screws 63. The L-shaped members each include a plurality of spaced-apart notches 63 and 64 which are aligned transversely of the rail system. Upon the insertion of the electronic modules 70 in their corresponding connectors 33 of each rail system, the L-shaped bars 61 and 62 are secured to flanges 59 and 60 of the U-shaped members 54 and 55 with the notches 63 and 64 embracing individual modules 70 and with the horizontal flange of the locking bars bearing on the shoulders 73—74 of the modules so that the modules are locked in a spaced-apart relationship with each other and mechanically secured with respect to vibration. The bars 61 and 62 are slotted as at 61a and 62a to permit lateral movement between locking and release positions.

As previously mentioned, the wiring of the control system is on the front side of each circuit board 27 facilitating the use of shorter wire runs to aid in providing noise immunity. The rails and the locking bars 61 and 62 therefore provide tunnels for the wiring which is effective as a Faraday shield to prevent the wiring from acting as antenna, preferably in the 1 to 10 megacycle range.

Figure 6:
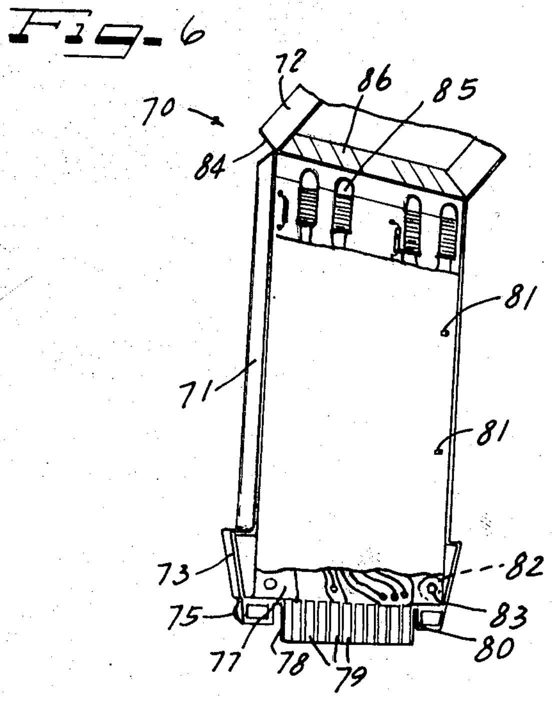
FIG. 6 is a pictorial illustration of a module opened to show the circuit board and the circuit board mounting apparatus.
Figure 5:
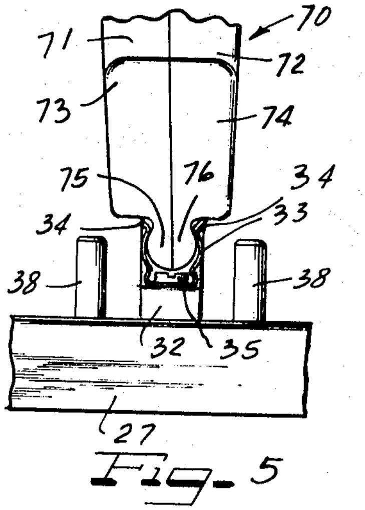
FIG. 5 is a partial side elevational view of the module-connector mechanical clamping apparatus.

Referring specifically to the electronic logic module illustrated in FIG. 6, there is shown a module housing or casing formed of two similar cooperable shells 71 and 72. The two shells are hingedly joined by a length of transparent or translucent tape 84 for ease of assembly and maintenance of the modules and in some constructions the hinge could be part of the shell. The tape 84 further functions as a label and contains all essential technical data for interconnection of the logic module functions with each other and other modules in a logic network. The module shells 71 and 72 include shoulder portions 73 and 74 respectively which bear against the bottom sides of the L-shaped locking bars 61 and 62 in the area of associated notches 63 and 64 of the locking bars. Shell portions 75 and 76 form bosses which cooperate to engage clamping springs 33 as set forth above for ensuring bottoming of the electronic circuit board 77 in its associated connector 29 and providing additional rigidity and strain relief. The base 70a of the shell bottom on the top surface 29a of the connector so that the conductory output terminals of the module do not engage the bottom of the socket and the board and output terminals are not in solid mechanical engagement.

Within each shell of the casing there are provided a plurality of spacing stands 81 and 82 which support the circuit board 77 when the casing is opened and which embrace the circuit board 77 from each side when the casing is closed. The circuit board and the casing are provided with a plurality of aligned apertures 83 for receiving self-tapping screws 83a to lock the casing about the circuit board and to form a closed housing. The circuit board includes a portion 78 which extends through an elongate aperture 80 in the housing for mating of its printed contacts 79 with the springs 30 of its associated electrical connector 29. Only a portion of the electrical components of board 77 are shown in FIG. 6.

A plurality of logic state indicating lamps 85 are provided as a visual indication of the logic states of the logic circuits. The shells 71 and 72 may be of an opaque material; however, such shells are preferably of a translucent material and include translucent sections 86 immediately adjacent the lamps 85 for the transmission of light. The indicating lamps 85 are advantageously employed to determine whether or not the logic and the controlling input signals to the logic are in accord.

While the indicating lamps 85 are provided in the logic modules 70, they are independently powered by a separate power supply of substantially equal operating voltages that are supplied to the logic circuits, for example +5 volts and 0 volts referenced to the power supply. Therefore, if there is a power supply failure for the logic circuits, the logic power supply may be replaced with the lamp power supply and operation may continue without the aid of the lamps until maintenance is performed.

Figures 7A, 7B:
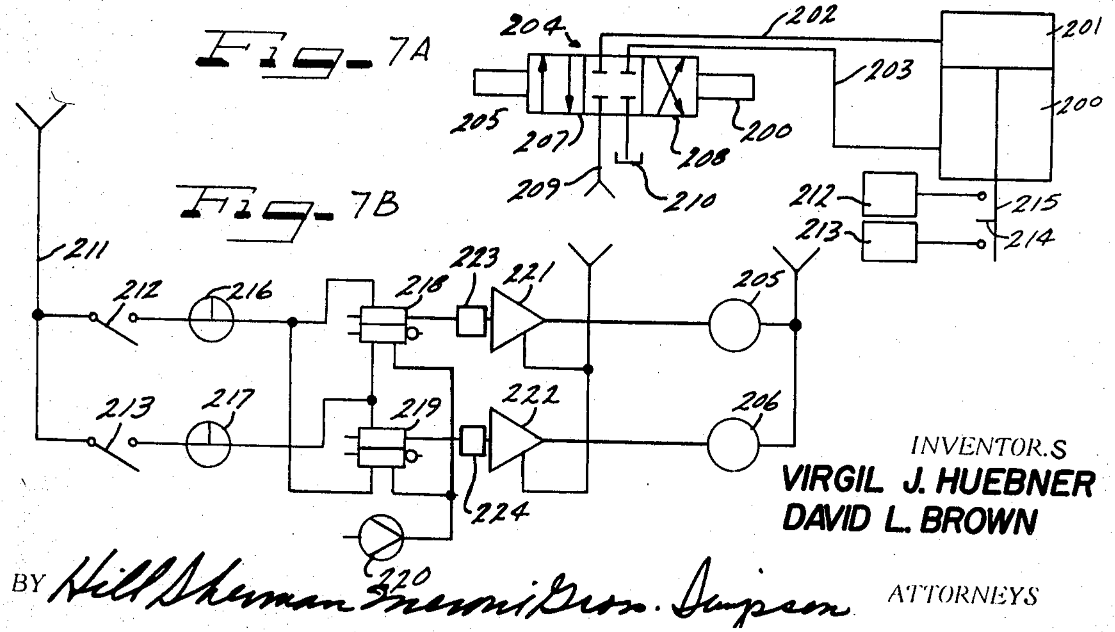
Figures 2, 3:
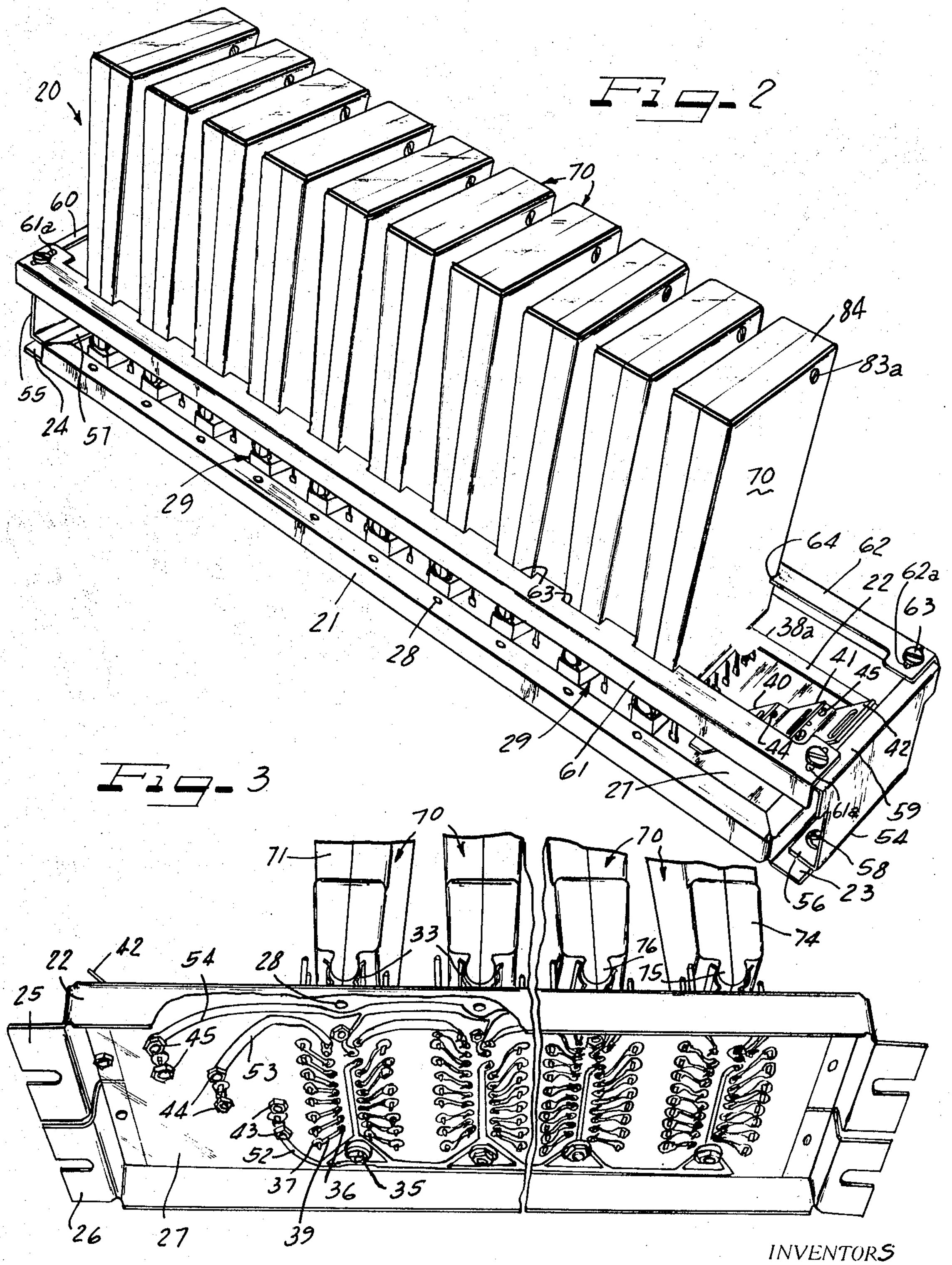
FIG. 2 is an isometric pictorial representation of a ten module rail system particularly illustrating the module locking bars and a portion of the power distribution system.
FIG. 3 is a pictorial representation of a back side of a rail system particularly showing a portion of the power distribution circuit of a rail system and the circuit connections between the modules and the system wiring and test terminals.
Figure 4:
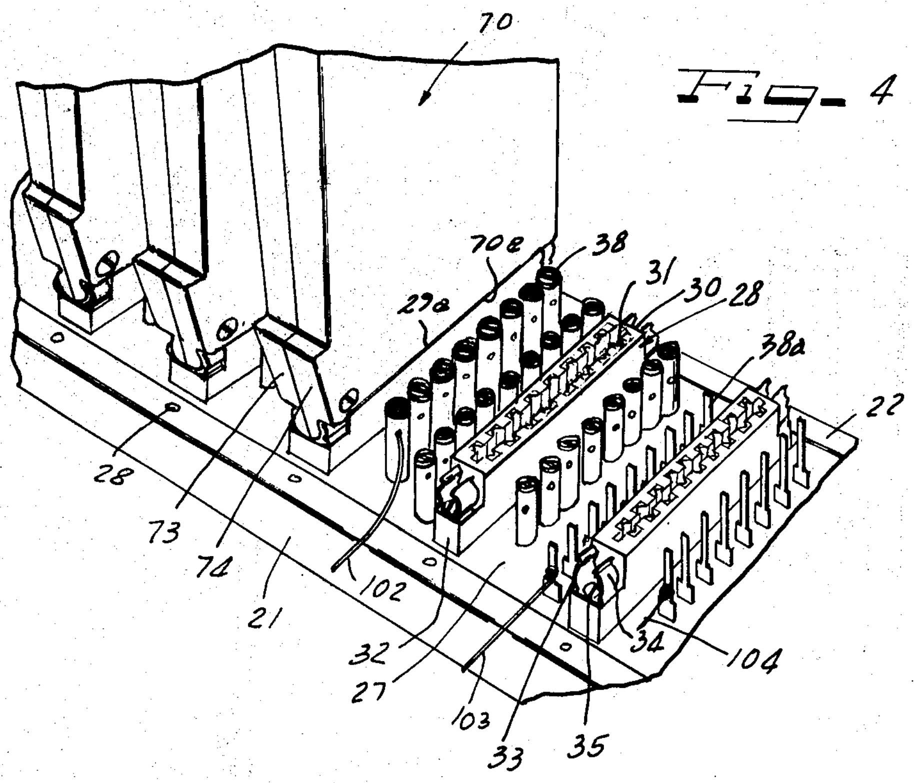
FIG. 4 is a pictorial view similar to FIG. 2, but with the locking bars and some modules removed from the rail system to show the electrical connectors and wiring and test terminals in greater detail.

Referring now to FIGS. 7A and 7B, there is illustrated an example of industrial equipment which may be logically controlled and a logic circuit for controlling such equipment.

The equipment comprises a piston cylinder 200, a piston 201, a pair of fluid control lines 202 and 203 connecting the cylinder 200 to a solenoid valve 204. The solenoid valve arrangement 204 includes solenoids 205 and 206 for operating the respective valve sections 207 and 208, an associated hydraulic pressure input 209 and a hydraulic pressure vent 210.

The control circuit includes an input supply 211, a pair of switches 212 and 213 as input functions to the logic which are also shown in FIG. 7A as elements cooperable with a movable contact 214 which is connected to piston shaft 215. A pair of indicating lamps 216 and 217 are interposed (symbolically) between the switches 212 and 213 and respective memory circuits 218 and 219. The upper halves of the memory circuits are the reset portions. It is evident from the drawing that a set of input of one memory is cross connected as a reset input to the other memory. Also connected to the reset portions of the memories is a master reset control which insures that the memories are reset upon the application of power.

Connected to the set output of each memory is an amplifier 221, 222 which in turn are connected to the solenoids 205 and 206 of the solenoid valve apparatus 204. Also connected to the solenoids 205 and 206 and to the AC amplifiers 221 and 222 is a power supply for operating the solenoid valve arrangement 204.

Interposed between the system logic and the loads are intergrating devices 223 and 224. Inasmuch as machine operation is slow with respect to the operating speeds of a digital control system, advantage is taken of this speed difference to provide additional noise immunity for the control system. The circuits 223 and 224 are capacitive in nature and insure that each logic output sees a positive load. The capacitive load provides a current sink and operates to intergrate noise, thereby providing an additional measure of noise immunity to the control system.

The modules contain circuitry to perform different functions. There are input modules which accept signals from outside the control panel. There are logic modules which are interconnected into a decision making network. There are also output modules which provide for power actuation outside the control panel for electromagnetic devices for implementing the decisions performed by the logic network. The modules are keyed by slots provided in the Fiberglas in the connector projection which mates with a tab in the connector 29, and the keying is arranged so that the different types of modules will fit only into their proper places on the rail.

The module cases are preferably made of plastic, but may be of metal, aluminum, for shielding from nonmagnetic radiation, for greater heat dissipation, and for better electromagnetic shielding. Windows will be provided for lights. The modules can be filled with an encapsulating resin to increase their tolerance to shock and vibration.

In the system as illustrated all the wiring of the circuit board is shielded from the back by a cabinet plate against which the rail is mounted, and on the sides by the rail. If desired the rails can be mounted at the edges with the back open so that individual wiring can be connected to the board from the back. Or a printed circuit board can be used to receive the pins 38a. The pins can be made elongate and project from the bottom of the board to plug into a large mother board to connect plural individual rails. These pins can be connected by flow soldering to the mother board.

It will be understood that the rails will available in varying sizes and capacities.

Although the invention has been described by reference to specific exemplary embodiments thereof, many changes and modifications may be made in the invention by one skilled in the art without departing from the spirit and scope of the invention as defined in the appended claims.

We claim:

1. A logic control module comprising:

a housing including first and second hollow shell portions;

a light transmitting portion and means forming a slot in said housings:

a hinge connecting said first and second shell portions;

a circuit board including a terminal portion and an electrical circuit having contacts on said terminal portion;

at least one lamp carried by said circuit board; and means for mounting said circuit board within said housing with said lamp adjacent said light transmitting portion of said housing and with said terminal portion of said circuit board extending through said slot for external connection to said contacts.

2. The module according to claim 1, wherein said circuit board carries a plurality of electrical components which are interconnected to form a logical control function and which includes an output connected to one of said contacts on said terminal portion for connection to a controlled device, and means serially connected between said output and the corresponding contact for making the controlled device appear as a capacitive load to the logic circuit.

3. The module according to claim 1, wherein said mounting means includes a plurality of ridges carried by each of said shells for clamping said circuit board when said shells are hinged closed to form said housing, and means for securing said shells in their closed positions.

4. Electrical control apparatus comprising:

a plurality of electrical control modules which are operable to generate heat, each of said control modules comprising a shaped housing including a wedge-shaped portion and a mounting portion;

means for mounting said plurality of modules in a spaced-apart array including aligned horizontal and vertical rows of said modules; and means forming air passageways for cooling said apparatus comprising the shaped housings of vertically aligned adjacent rows wherein horizontally adjacent housings define wedge-shaped air passages therebetween.

5. The apparatus according to claim 4, wherein said means for mounting said modules comprises a plurality of spaced-apart mounting rail systems each of which includes means for releasably engaging the modules of at least one of said rows of the array.

6. Modular control apparatus for controlling the operation of a machine in an area of electrical magnetic radiation, comprising:

a frame;

a plurality of electrical control modules for controlling the operation of the machine;

means for mounting said electrical control modules on said frame; including at least one pair of spaced-apart elongate rails for connection to said frame, and a plurality of electrical connector devices for mounting said modules, said connector devices carried in an insulated relationship between said rails;

a plurality of electrical terminals connected to said electrical connector devices for the interconnection of said modules and the machine;

a plurality of electrical conductors some of which are selectively connected between said terminals for the selective interconnection of said modules, and others of which are provided for connection to the machine; and a pair of spaced-apart elongate clamping bars mounted parallel to said rails and adjustable transversely thereof clamping said modules in said connectors, said electrical conductors disposed between said clamping bars and said rails, said bars and said rails forming at least a partial Faraday shield to protect said conductors from electromagnetic radiation.

7. The control apparatus according to claim 6, wherein each of said control modules comprises:

a circuit board including a connecting portion for releasable engagement with a corresponding one of said electrical connector devices;

an electrical circuit carried on said circuit board including contact portions on said connecting portions; and a housing, said circuit board being secured within said housing and said housing including means for releasably engaging the corresponding electrical connector.

8. The control apparatus according to claim 6, wherein said mounting means comprises:

a plurality of pairs of said spaced-apart elongate rails secured to said frame;

a plurality of nonconductive substrates each of which carry separate ones of said electrical connector devices and each of which is secured to a separate pair of said rails; and wherein said control apparatus further includes a power distribution system comprising, electrical power conductors carried on each said substrate and connected to the corresponding control modules; and a plurality of power distribution connecting means carried by each of said substrates and connected to the electrical power conductors carried thereby; and a plurality of power buses extending transversely of the spaced-apart rails for connection to the power supply, each of said power buses being connected to a separate power connecting means of each said substrate.

9. Modular control apparatus for controlling a machine in an area of electromagnetic radiation comprising:

a frame;

terminal means including first terminals for connection to said machine and second terminals to be selectively interconnected among themselves and with said first terminals;

a plurality of electrical control modules each of which includes an electrical circuit board having an electrical circuit thereon and a connecting portion, a housing, said circuit board secured within said housing, said housing including locking portions; means for mounting said plurality of control modules on said frame including a pair of spaced-apart elongate rails secured to said frame and a plurality of electrical connector devices connected to said terminal means and carried between said rails for releasable engagement with said connecting portions of said electrical circuit boards; and a plurality of electrical conductors selectively interconnecting said first terminals and said second terminals, and second conductors selectively interconnecting said second terminals; and means cooperating with said pair of elongate rails for embracing said electrical conductors and providing an electromagnetic shield therefore including a pair of spaced-apart elongate bars comprising mutually facing portions including a plurality of notches aligned across the spacing therebetween, said notch portions embracing said plurality of control modules and bearing on said locking portions of said housings to secure said control modules in engagement with said electrical connector devices, and support means connecting said pair of bars and said pair of rails in spaced-apart relation.

10. Modular control apparatus for controlling a machine in an area of electromagnetic radiation comprising:

a frame;

terminal means for connection to said machine;

a plurality of electrical control modules;

first electrical conductors for connecting certain ones of said plurality of control modules to said terminal means; means for mounting said plurality of control modules on said frame including:

a pair of elongate spaced-apart rails secured to said frame;

a plurality of electrical connector devices for releasably engaging said plurality of control modules;

a substrate connected to said elongate rails, said substrate having electrical terminals thereon connected to said first electrical conductors;

second electrical conductors selectively interconnecting said terminals, circuit means carried on said substrate electrically connecting each of said connector devices with respective ones of said terminals, and said plurality of connector devices carried on said substrate;

a plurality of resilient clamping means secured to said substrate adjacent said electrical connector devices, each of said modules including a boss portion releasably received by the resilient clamping means; and means cooperating with said mounting means for embracing said first electrical conductors and said second electrical conductors and providing an electromagnetic shield therefore including a pair of spaced-apart locking bars secured parallel to said pair of rails and adjustable transversely thereto engaging said electrical control modules and cooperating with said rails to provide electromagnetic shielding for said conductors.